United States Patent
Lovelace et al.

[11] Patent Number: 6,137,999
[45] Date of Patent: Oct. 24, 2000

[54] IMAGE REJECT TRANSCEIVER AND METHOD OF REJECTING AN IMAGE

[75] Inventors: David Kevin Lovelace, Chandler; Michael McGinn, Tempe, both of Ariz.

[73] Assignee: Motorola, Inc., Schaumburg, Ill.

[21] Appl. No.: 08/998,367

[22] Filed: Dec. 24, 1997

[51] Int. Cl.[7] .............................. H04B 1/10; H04B 1/46; H04B 1/40; H03D 3/18
[52] U.S. Cl. ......................... 455/302; 455/302; 455/304; 455/82; 455/76; 375/327
[58] Field of Search .................... 455/76, 78, 82, 455/83, 84, 86, 302, 303, 304, 324; 375/327, 328, 329, 331, 320, 375, 377, 307, 308, 298, 284, 285, 280, 219, 350, 376

[56] References Cited

U.S. PATENT DOCUMENTS

| | | | |
|---|---|---|---|
| 2,964,622 | 12/1960 | Fire | 455/304 |
| 4,105,975 | 8/1978 | Sanders et al. | 325/320 |
| 4,903,257 | 2/1990 | Takeda et al. | 370/29 |
| 5,081,650 | 1/1992 | Hasegawa et al. | 375/80 |
| 5,802,463 | 9/1998 | Zuckerman | 455/208 |

*Primary Examiner*—Daniel S. Hunter
*Assistant Examiner*—Meless Zewdu
*Attorney, Agent, or Firm*—Lanny L. Parker

[57] ABSTRACT

An image reject transceiver (10) provides both phase and gain adjustments that causes unwanted images to be rejected. A reference signal ($RF_{IN}$) is frequency translated by two mixer circuits (28, 34) in a receiver circuit (16) to provide both an in-phase and an out-of-phase replica signal of the reference signal ($RF_{IN}$) during normal operation. In a calibration mode a single frequency generated by a transmitter VCO (22) replaces the reference signal ($RF_{IN}$). A phase detector circuit (38) provides a phase difference value that is fed back through a first switch (45) to a phase shift circuit (36) for adjusting the phase separation between the two replica signals. An amplitude detector circuit (40) provides an amplitude error value that is fed back through a second switch (47) to the mixer circuit (34) for adjusting and matching the gain of the two replica signals.

17 Claims, 2 Drawing Sheets

IMAGE REJECT TRANSCEIVER AND METHOD OF REJECTING AN IMAGE

BACKGROUND OF THE INVENTION

The present invention relates, in general, to integrated circuits and, more particularly, to integrated circuits having an image reject transceiver.

In electronic systems such as cellular or wireless telephones, and image detectors for televisions, among others, a phase and frequency relationship exists between an incoming reference signal and a signal generated by a Voltage Controlled Oscillator (VCO). Typically, mixers in a heterodyne receiver translate a Radio Frequency (RF) signal to a lower Intermediate Frequency (IF) signal. The mixers multiply the received RF signal with a Local Oscillator (LO) signal to generate the sum and difference frequencies between the RF and LO signals. A filter circuit is used to select the difference frequency, i.e., a mixed down signal, for recovering the modulation information that is contained in the translated RF signal.

Unwanted images having frequencies either higher or lower than the LO signal are also present at the input of the receiver. The unwanted images are also translated in frequency by the mixers. It is desired that the signals at the outputs of the mixers be in-phase while the unwanted images be one hundred and eighty degrees out-of-phase and equal in amplitude. By summing the signals at the outputs of the mixers, the unwanted images being out-of-phase and equal in amplitude would completely cancel, while the desired signals would add.

However, it is difficult to maintain equivalent signal attenuation and a phase relationship of one hundred and eighty degrees between the unwanted images with voltage and temperature changes in a heterodyne receiver. Further, a typical heterodyne receiver includes two passive filters that provide rejection of the unwanted images. Requiring filters for the input RF signal to reduce the amplitude of the unwanted image adds additional costs to the heterodyne receiver.

Accordingly, it would be advantageous to have a method and circuit for frequency translating an incoming reference signal that causes unwanted images to be rejected. It would be of further advantage to provide both gain attenuation and a phase relationship that dynamically correct the translated signal for complete image rejection.

DETAILED DESCRIPTION OF THE DRAWINGS

Generally, the present invention provides phase detection and gain attenuation for an image reject transceiver that causes unwanted images to be rejected. The reference signal $RF_{IN}$ is frequency translated by two mixers to provide both a reference replica and a quadrature replica signal of the incoming reference signal. A phase detection circuit provides a phase difference value in accordance with a phase separation between the two replica signals. The phase difference value is fed back to a phase shift circuit for adjusting the phase separation between the two replica signals. Additionally, an amplitude detector circuit provides an amplitude error value for adjusting and matching the gain of the two replica signals. By adjusting both the phase and gain of the translated signals, the undesired image is rejected in the receiver portion of the image reject transceiver.

Figure 1:
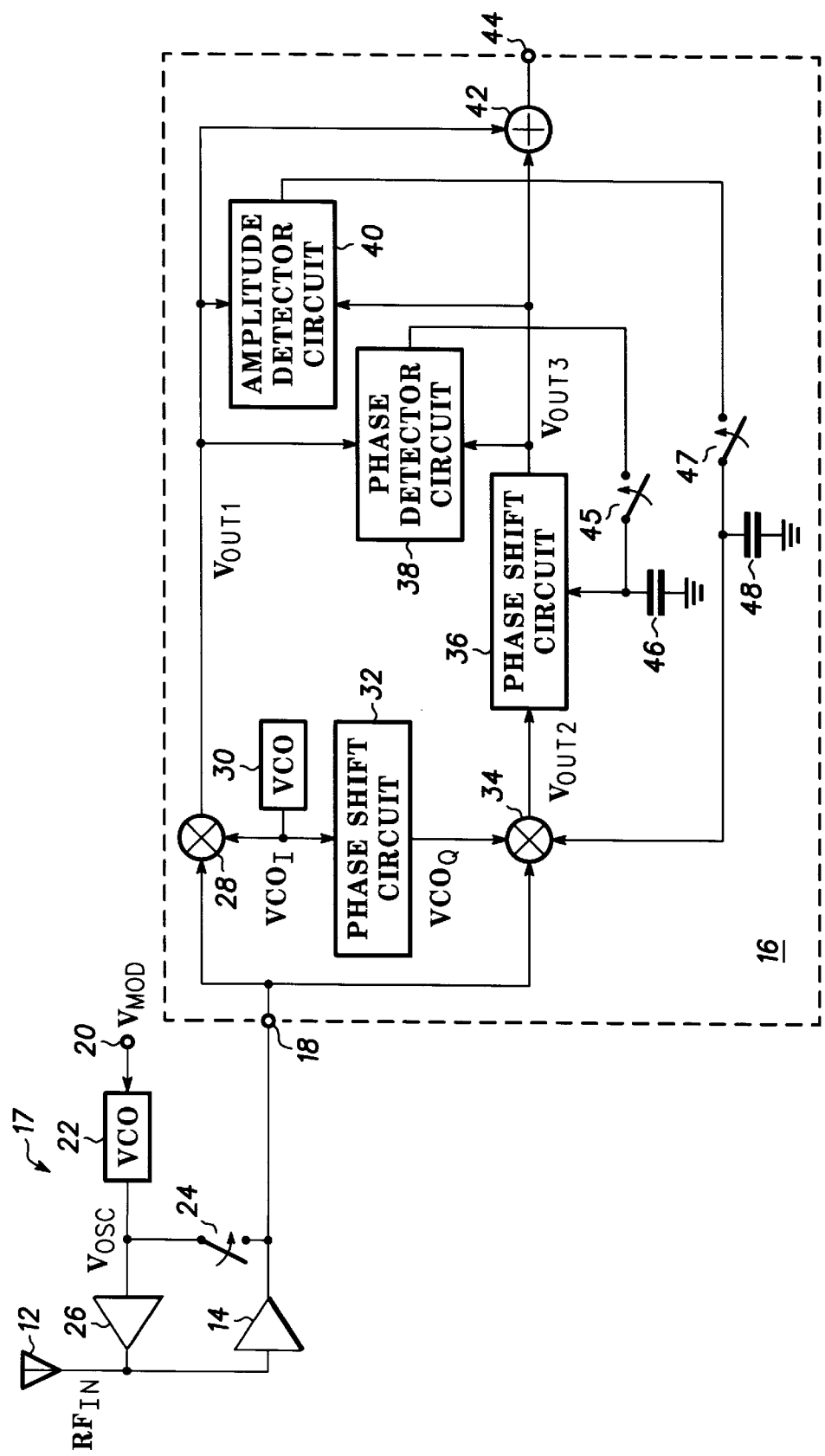
FIG. 1 is a block diagram of an image reject transceiver in accordance with the present invention.

FIG. 1 is a block diagram of an image reject transceiver 10 in accordance with the present invention. Image reject transceiver 10 includes both a receiver circuit 16 and a transmitter portion 17. In the receiver portion that includes receiver circuit 16, a signal $RF_{IN}$ is received by an antenna 12 and transferred through buffer circuit 14 to an input 18 of receiver circuit 16. The transmit portion of image reject transceiver 10 includes a transmitter VCO 22 that is coupled for receiving a modulating signal, $V_{MOD}$, at terminal 20 and generating an output signal $V_{OSC}$. The signal $V_{OSC}$ at an output of VCO 22 is transferred through buffer circuit 26 to antenna 12. In addition, the output of VCO 22 is coupled to input 18 of receiver circuit 16 via a switch 24. Preferably, switch 24 is a transistor having a control terminal and two current carrying terminals. By way of example, switch 24 can be a bipolar transistor, a Field Effect Transistor (FET), or the like.

Receiver circuit 16 further includes two mixer circuits, 28 and 34, for quadrature mixing of the signal $RF_{IN}$ received at input 18 with respective signals $VCO_I$ and $VCO_Q$. More particularly, mixer circuits 28 and 34 each have an input that is coupled for receiving the transmitted reference signal $RF_{IN}$. A second input of mixer circuit 28 is commonly connected to an output of a receiver VCO 30 and to an input of a phase shift circuit 32. An output of mixer circuit 28 is commonly connected to an input of a phase detector circuit 38, to an input of an amplitude detector circuit 40, and to an input of summing circuit 42. Mixer circuit 28 is referred to as an in-phase translator (I-mixer) because it generates an output signal, $V_{OUT1}$, that is a translated reference representation of the signal $RF_{IN}$ mixed down directly from VCO 30.

A second input of mixer circuit 34 is coupled to the output of VCO 30 via phase shift circuit 32. A signal $VCO_I$ generated by VCO 30 is phase shifted and becomes the signal $VCO_Q$ at the output of phase shift circuit 32. An output of mixer circuit 34 is connected to an input of a phase shift circuit 36. Mixer circuit 34 is referred to as a quadrature translator (Q-mixer) because it generates an output signal, $V_{OUT2}$, that is in quadrature with the mixed down translated signal $V_{OUT1}$. An output of phase shift circuit 36 is commonly connected to a second input of phase detector circuit 38, a second input of amplitude detector circuit 40, and a second input of summing circuit 42. An output of summing circuit 42 serves as output 44 of image reject transceiver 10. A signal $V_{OUT3}$ generated at the output of quadrature phase shift circuit 36 is typically phase shifted from the signal $V_{OUT2}$ by ninety degrees.

In addition, phase detector circuit 38 has an output that is connected to a current carrying terminal of a switch 45. A second current carrying terminal of switch 45 is connected to a third input of quadrature phase shift circuit 36 and to a terminal of a capacitor 46. A second terminal of capacitor 46 is connected to a power supply conductor such as, for example, ground. Alternatively, the output of phase detector circuit 38 could be coupled through switch 45 to another input of quadrature phase shift circuit 32 (not shown). An output of amplitude detector circuit 40 is connected to a current carrying terminal of a switch 47. A second current carrying terminal of switch 47 is connected to a third input of mixer circuit 34 and to a first terminal of a capacitor 48. A second terminal of capacitor 48 is connected to a power supply conductor such as, for example, ground. Switches 24, 45, and 47 have commonly connected control terminals (not shown) that are coupled to receive a time segment signal. Like switch 24, switches 45 and 47 can be bipolar transistors, FETs, or the like. It should be noted that signal $RF_{IN}$ is translated from a signal in the Radio Frequency (RF) range to signals $V_{OUT1}$ and $V_{OUT3}$ that are in the Intermediate Frequency (IF) range.

For simplicity the signals $RF_{IN}$, $VCO_I$, $VCO_Q$, $V_{OUT1}$, $V_{OUT2}$, $V_{OUT3}$, and the feedback signals at the outputs of phase detector circuit 38 and amplitude detector circuit 40 have been shown as single-ended signals. Typically, for high frequency applications of image reject transceiver 10 the signals $RF_{IN}$, $VCO_I$, $VCO_Q$, $V_{OUT1}$, $V_{OUT2}$, $V_{OUT3}$, and the feedback signals at the outputs of phase detector circuit 38 and amplitude detector circuit 40 are differential signals. Thus, it is not a limitation of the present invention that the signals in image reject transceiver 10 be single-ended signals.

Image reject transceiver 10 operates in two modes: a normal transceiver mode and a calibration mode. In the normal transceiver mode switches 24, 45, and 47 are open and data is either being received or transmitted through antenna 12. Mixer 28 multiplies the received signal $RF_{IN}$ with the signal $VCO_I$ to produce signal $V_{OUT1}$ that has a component that is the sum of the signals $RF_{IN}$ and $VCO_I$ and a component that is the difference of the signals $RF_{IN}$ and $VCO_I$. Thus, the signal $V_{OUT1}$ is translated in frequency and is a first replica of the signal $RF_{IN}$. In addition, an undesired image at the input of image reject transceiver 10 has a frequency that is offset to the frequency of VCO 22. In other words, image reject transceiver 10 receives a signal $RF_{IN}$ having a higher frequency than the frequency of the signal generated by VCO 22 and an undesired signal having a frequency that is lower in frequency than the frequency of the signal generated by VCO 22. Thus, in addition to the signal $V_{OUT1}$ being a translated first replica of the signal $RF_{IN}$, the signal $V_{OUT1}$ has an undesired frequency component that is translated down in frequency by the same amount as the first replica signal. It should be noted that the undesired image at the input of image reject transceiver 10 could have a frequency that is higher than the frequency of the signal generated by VCO 22. Summing circuit 42 could then provide a difference value that is the difference between the signals $V_{OUT1}$ and $V_{OUT3}$ and that causes cancellation of the undesired image.

Similarly, a multiplication of the received signal $RF_{IN}$ with the signal $VCO_Q$ by mixer circuit 34 results in a signal $V_{OUT2}$ having a component that is the sum of the signals $RF_{IN}$ and $VCO_Q$ and a component that is the difference of the signals $RF_{IN}$ and $VCO_Q$. Thus, the signal $V_{OUT2}$ is translated in frequency and is a second replica of the signal $RF_{IN}$, but phase shifted by ninety degrees with respect to the signal $V_{OUT1}$. Again, an undesired image is received at the input of image reject transceiver 10 and has a frequency that is offset by the frequency of VCO 22. Thus, in addition to the signal $V_{OUT2}$ being a translated second replica of the signal $RF_{IN}$, the signal $V_{OUT2}$ has an undesired frequency component, i.e., the undesired image is translated down in frequency by the same amount as the second replica signal.

Phase shift circuit 36 further shifts the phase of the signal $V_{OUT2}$, i.e., both the desired replica signal and the undesired frequency component, by ninety degrees in generating the signal $V_{OUT3}$. It should be noted that the desired frequency component of the signal $V_{OUT3}$ is in-phase with the desired frequency component of the signal $V_{OUT1}$, but the undesired image components of the signals $V_{OUT1}$ and $V_{OUT3}$ are one hundred and eighty degrees out-of-phase. Ideally, by generating the sum of the signals $V_{OUT1}$ and $V_{OUT3}$, the undesired frequency components, being out-of-phase with respect to each other, are canceled and only the desired first and second replica signals remain. In other words, cancellation of the undesired frequency components in the signal at output 44 causes complete image rejection.

However, when the amplitudes of the image component of the signals $V_{OUT1}$ and $V_{OUT3}$ do not match or do not have a phase separation of one hundred and eighty degrees, then the undesired frequency component in signal $V_{OUT1}$ does not cancel the undesired frequency component in signal $V_{OUT3}$. In other words, amplitude or phase errors signify that the undesired image has not been completely rejected in the signal at output 44.

Figure 2:
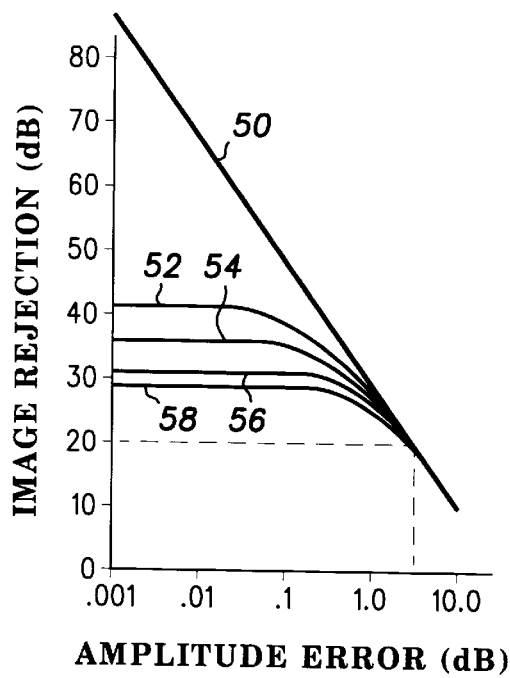
FIG. 2 illustrates a plot of image rejection versus amplitude error for the receiver portion of the image reject transceiver of FIG. 1.

FIG. 2 is a plot of image rejection versus amplitude error in accordance with the present invention, where amplitude error is the difference in the amplitudes of the signals $V_{OUT1}$ and $V_{OUT3}$. It should be noted that in FIG. 2, the horizontal axis is a logarithmic scale that represents the amount of amplitude error in the signals $V_{OUT1}$ and $V_{OUT3}$. The vertical axis represents the amount of image rejection from the signal at output 44. Curves 50, 52, 54, 56, and 58 illustrate phase errors of zero degrees, one degree, two degrees, three degrees, and four degrees, respectively. The phase error is the phase angle of one hundred and eighty degrees minus the difference in the phase angle between the signals $V_{OUT1}$ and $V_{OUT3}$. By way of example, curve 50 illustrates a phase error of zero signifying that signals $V_{OUT1}$ and $V_{OUT3}$ are one hundred and eighty degrees out-of-phase. Thus, curve 50 shows that signals $V_{OUT1}$ and $V_{OUT3}$ having a phase error of about zero and an amplitude error of about 0.01 dB (decibels) or less cause an image rejection of greater than about 65 dB. Additionally, an amplitude error of about 0.001 dB or less causes an image rejection of greater than about 85 dB. On the other hand, curve 52 shows that signals $V_{OUT1}$ and $V_{OUT3}$ having a phase error of about one degree and an amplitude error of 0.01 dB or less have an image rejection of about 42 dB.

Figure 3:
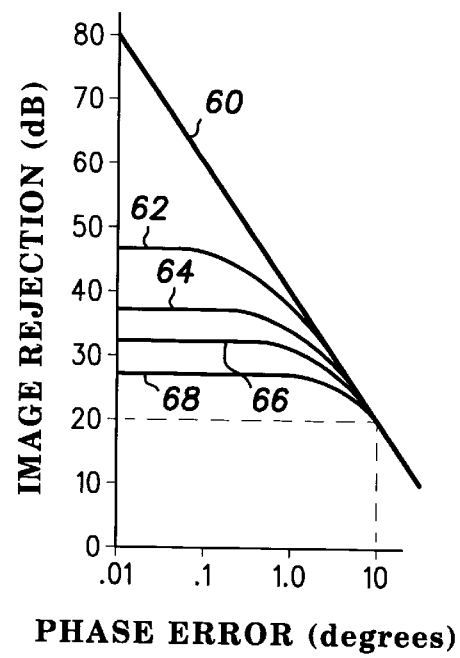
FIG. 3 illustrates a plot of image rejection versus phase error for the receiver portion of the image reject transceiver of FIG. 1.

FIG. 3 is a plot of image rejection versus phase error in accordance with the present invention, where the horizontal axis is a logarithmic scale representing cumulative phase error between the signals $V_{OUT1}$ and $V_{OUT3}$. The vertical axis represents the amount of image rejection in the signal at output 44. Curves 60, 62, 64, 66, and 68 represent amplitude errors of 0 dB, 0.1 dB, 0.25 dB, 0.5 dB, and 0.75 dB, respectively. The amplitude error is the difference in amplitudes between signals $V_{OUT1}$ and $V_{OUT3}$. By way of example, curve 60 shows that signals $V_{OUT1}$ and $V_{OUT3}$ having an amplitude error of about zero and a phase error of about 0.1 degrees or less cause an image rejection of about 60 dB. On the other hand, curve 62 shows that signals $V_{OUT1}$ and $V_{OUT3}$ having an amplitude error of about 0.1 dB and a phase error of about 0.1 degrees or less cause an image rejection of about 46 dB.

FIGS. 2 and 3 show the effects of mismatched phase and gain products of mixer circuits 28 and 34 and the inaccurate phase shifting of phase shift circuits 32 and 36 on the amount of image rejection of the signal at output 44. Thus, process and temperature variations in mixer circuits 28 and 34 and phase shift circuits 32 and 36 that cause mismatched phase and gain products can lead to reduced rejection of the undesired image when not dynamically corrected in accordance with the present invention. Image reject transceiver 10 provides image rejection through dynamic correction of phase and gain errors.

Figure 4:
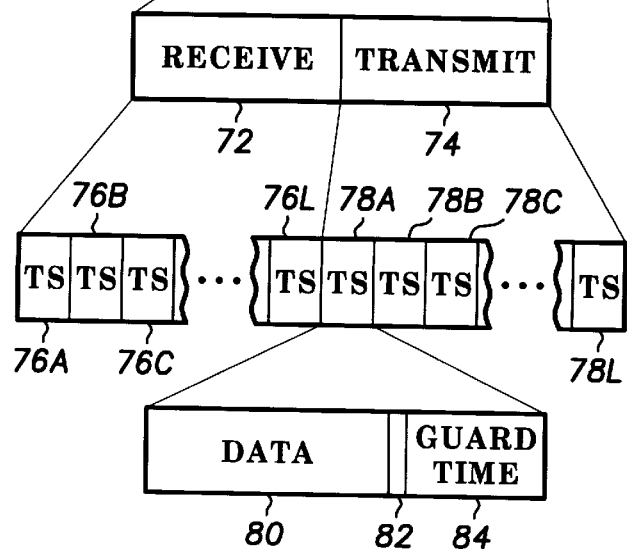
FIG. 4 illustrates a time segment during which phase and amplitude corrections are generated for the image reject transceiver of FIG. 1.

FIG. 4 illustrates a time segment during which phase and amplitude corrections are generated for image rejection in the time multiplexed image reject transceiver 10 of FIG. 1. The calibration mode takes advantage of using the time segments during a transmission time period. Data is often arranged into packets for improving transmission bandwidth. By way of example, time division multiplexing arranges data into packets or frames 70A, 70B, and 70C.

Each frame includes a receive slot 72 and a transmit slot 74. Each receive slot 72 is comprised of a number of Time Slots (TS) 76A, 76B, 76C, ..., and 76L. Similarly, each transmit slot 78 is comprised of a number of time slots 78A, 78B, 78C, ..., and 78L. It should be noted that the number of time slots included in either receive slot 72 or transmit slot 74 is not a limitation of the present invention.

In addition, a time slot such as for example, time slot 78A, further includes a portion 80, a portion 82, and a portion 84. Portions 80, 82, and 84 are also referred to as time segments. By way of example, data and control bits are transmitted during portion 80, channel information relating to data contained in a subsequent time slot 78B is transmitted during portion 82, and VCO 30 (FIG. 1) is relocked to the frequency of the data being transmitted in time slot 78B during portion 84. It should be noted that the number of portions included in each time slot is not a limitation of the present invention. It should be further noted that the functions performed during portions 80, 82, and 84 are also not limitations of the present invention. In other words, image reject transceiver 10 can use any time slot and any portion or combination of portions in the calibration mode to adjust both the amplitude and the phase of the signals $V_{OUT1}$ and $V_{OUT3}$.

Referring to FIG. 1, the calibration mode occurs, for example, when portion 84 (FIG. 4) is in a first logic state and switches 24, 45, and 47 are closed. In accordance with the present invention, data is neither received nor transmitted through antenna 12, but the signal $V_{OSC}$ is transmitted through switch 24 to receiver circuit 16. By design, VCO 22 is locked to the same frequency as the received signal $RF_{IN}$ and can therefore be used as a single frequency signal or tone to calibrate receiver circuit 16.

During the calibration mode, mixer circuit 28 generates the signal $V_{OUT1}$ having a component that is the sum of the signals $V_{OSC}$ and $VCO_I$ and a component that is the difference of the frequencies for the signals $V_{OSC}$ and $VCO_I$. Similarly, the signal $V_{OUT2}$ has a component that is the sum of the signals $V_{OSC}$ and $VCO_Q$ and a component that is the difference of the frequencies for the signals $V_{OSC}$ and $VCO_Q$, but they are phase shifted by ninety degrees with respect to the signal $V_{OUT1}$. In addition, phase shift circuit 36 shifts the phase of the signal $V_{OUT2}$ by about ninety degrees in generating the signal $V_{OUT3}$. By transferring a single tone to input 18 of receiver circuit 16, any phase and amplitude errors caused by receiver circuit 16 can be corrected while in the calibration mode. Thus, a combined phase shift of phase shift circuits 32 and 36 can be determined by phase detector circuit 38 and an appropriate phase feedback signal generated and fed to phase shift circuit 36 to correct for phase errors. In addition, amplitude detector circuit 40 can determine the difference in amplitudes for the signals $V_{OUT1}$ and $V_{OUT3}$ and generate an appropriate amplitude feedback signal to mixer circuit 34 to correct for amplitude errors.

Amplitude detector circuit 40 generates an amplitude feedback signal having an analog value that is substantially equivalent to the difference in the amplitudes of the signals $V_{OUT1}$ and $V_{OUT3}$. The analog value is transferred through switch 47 and stored on capacitor 48. By way of example, an increased charge stored on capacitor 48 causes mixer circuit 34 to increase the amplitude of the signal $V_{OUT2}$. On the other hand, a decreased charge stored on capacitor 48 causes mixer circuit 34 to decrease the amplitude of the signal $V_{OUT2}$. The periodicity of portion 84 (FIG. 4) assures that the charge stored on capacitor 48 during the calibration mode is maintained. An amplitude change in the signal $V_{OUT2}$ causes a corresponding amplitude change in the signal $V_{OUT3}$. Thus, the amplitude feedback signal is adjusted until the amplitude of the signal $V_{OUT1}$ is matched to the amplitude of the signal $V_{OUT3}$.

In addition, phase detector circuit 38 receives the signals $V_{OUT1}$ and $V_{OUT3}$ and adjusts the amplitude of the phase feedback signal in accordance with the relationship between the phase of signals $V_{OUT1}$ and $V_{OUT3}$. By way of example, a phase difference of about zero degrees, which corresponds to the image signals having a phase separation of about one hundred and eighty degrees, generates a phase feedback signal having an amplitude of about zero. On the other hand, a phase separation for the image signals that is not one hundred and eighty degrees generates a phase feedback signal having an amplitude value greater than zero. The analog value is transferred through switch 45 and stored on capacitor 46. The phase of the signal $V_{OUT3}$ is adjusted in accordance with the charge stored on capacitor 46. The periodicity of portion 84 (FIG. 4) assures that the charge stored on capacitor 46 during the calibration mode is maintained. Thus, phase detector circuit 38 adjusts the relative phase of signals $V_{OUT1}$ and $V_{OUT3}$ until the phase difference is zero degrees and the image signals have a phase separation of one hundred and eighty degrees.

Any irregularities in phase shift circuits 32 and 36 that cause signals $V_{OUT1}$ and $VOUT_3$ to not have a zero degree phase relationship can be detected by phase detector circuit 38. In addition, any irregularities that cause amplitude differences in signals $V_{OUT1}$ and $V_{OUT3}$ can be detected by amplitude detector circuit 40. Thus, irregularities caused by voltage and temperature changes on the elements of receiver circuit 16 can be dynamically detected and corrected.

By now it should be appreciated that a structure and a method have been provided that allow frequency translation of an input signal to a lower frequency while rejecting undesired images. Phase errors and amplitude errors are detected and dynamically corrected during a calibration mode to provide rejection of the undesired image.

What is claimed is:

1. An image reject transceiver, comprising:
   a transmitter voltage controlled oscillator supplying an oscillator signal at an output;
   a first switch having a first terminal coupled to the output of the transmitter voltage controlled oscillator and a control terminal coupled for receiving a signal; and
   a receiver having an input coupled to a second terminal of the first switch, the receiver includes
      a first phase shift circuit having a first input coupled to the input of the receiver,
      a phase detector circuit having a first input coupled to the input of the receiver and a second input coupled to an output of the first phase shift circuit, and
      a second switch having a control terminal coupled to the control terminal of the first switch, a first terminal coupled to an output of the phase detector circuit, and a second terminal coupled to a second input of the first phase shift circuit.

2. The image reject transceiver of claim 1, wherein the receiver further comprises a capacitor having a first terminal coupled to the second input of the first phase shift circuit and a second terminal coupled to a power supply conductor.

3. The image reject transceiver of claim 2, wherein the receiver further comprises:
   a receiver voltage controlled oscillator having an output;
   a first mixer having first and second inputs and an output, wherein the first input is coupled to the input of the receiver and the output is coupled to the first input of the phase detector circuit;
   a second phase shift circuit having an input and an output, wherein the input is commonly coupled to the second input of the first mixer and to the output of the receiver voltage controlled oscillator; and a second mixer having first and second inputs and an output, wherein the first input is coupled to the input of the receiver, the second input is coupled to the output of the second phase shift circuit, and the output is coupled to the first input of the first phase shift circuit.

4. The image reject transceiver of claim 1, wherein the receiver further comprises:

a receiver voltage controlled oscillator having an output;

a first mixer having first and second inputs and an output, wherein the first input is coupled to the input of the receiver;

a first phase shift circuit having an input and an output, wherein the input is commonly coupled to the output of the receiver voltage controlled oscillator and to the second input of the first mixer;

a second mixer having a first input, a second input, a third input, and an output, wherein the first input is coupled to the input of the receiver and the second input is coupled to the output of the first phase shift circuit;

a second phase shift circuit having an input and an output, wherein the input is coupled to the output of the second mixer;

an amplitude detector circuit having first and second inputs and an output, wherein the first input is coupled to the output of the first mixer and the second input is coupled to the output of the second phase shift circuit; and a second switch having a control terminal coupled to the control terminal of the first switch, a first current carrying terminal coupled to the output of the amplitude detector circuit, and a second current carrying terminal coupled to the third input of the second mixer.

5. The image reject transceiver of claim 4, wherein the receiver further comprises a capacitor having a first terminal coupled to the third input of the second mixer and a second terminal coupled to a power supply conductor.

6. A circuit suitable for use in an image reject transceiver, comprising:

a phase detector circuit having first and second inputs and an output, wherein the first input is coupled for receiving a first signal;

a phase shift circuit having first and second inputs and an output, wherein the output is coupled to the second input of the phase detector circuit; and a first switch having a control terminal and first and second current carrying terminals, wherein the first current carrying terminal is coupled to the output of the phase detector circuit, the second current carrying terminal is coupled to the second input of the phase shift circuit, and the control terminal is coupled for receiving a second signal.

7. The circuit of claim 6, further comprising a first capacitor having a first terminal coupled to the second input of the phase shift circuit and a second terminal coupled to a power supply conductor.

8. The circuit of claim 6, further comprising:

an amplitude detector circuit having first and second inputs and an output, wherein the first input is coupled to the first input of the phase detector circuit and the second input is coupled to the second input of the phase detector circuit;

a mixer circuit having first and second inputs, and an output, wherein the first input is coupled for receiving a third signal, and the output is coupled to the first input of the phase shift circuit; and a second switch having a control terminal and first and second current carrying terminals, wherein the first current carrying terminal is coupled to the output of the amplitude detector circuit, the second current carrying terminal is coupled to the second input of the mixer circuit, and the control terminal is coupled to the control terminal of the first switch.

9. The circuit of claim 8, further comprising a second capacitor having a first terminal coupled to the second input of the mixer circuit and a second terminal coupled to a power supply conductor.

10. A method of rejecting an image in a receiver, comprising the steps of:

selecting a portion of a transmission time period as a time segment;

transferring a first signal from a transmitter of a transceiver to a receiver of the transceiver during the time segment;

generating second and third signals from the first signal; and adjusting the second and third signals for calibration during the time segment, which rejects the image in the receiver.

11. The method of claim 10, wherein the step of adjusting the first and second signals further comprises changing a phase relationship between the second and third signals, which calibrates the receiver for phase.

12. The method of claim 11, wherein the step of changing a phase relationship between the second and third signals further includes storing a charge on a capacitor, wherein the charge stored on the capacitor causes the third signal to shift in phase relative to the second signal.

13. The method of claim 10, wherein the step of adjusting the second and third signals further comprises changing an amplitude of the second signal to substantially match the third signal, which rejects the image in the receiver.

14. The method of claim 13, wherein the step of changing an amplitude of the second signal further includes storing a charge on a capacitor, wherein the amplitude of the second signal changes in accordance with the charge on the capacitor.

15. The method of claim 10, wherein the step of selecting a portion of the transmission time period as a time segment includes switching from a normal operating mode to a calibration mode when the time segment has a first logic state.

16. The method of claim 10, wherein the step of transferring a first signal includes transferring a single frequency signal.

17. The method of claim 10, wherein the step of generating second and third signals from the first signal includes translating the second and third signals at substantially a same frequency as the single frequency signal.

* * * * *